US009911788B2

(12) United States Patent
Yang et al.

(10) Patent No.: US 9,911,788 B2
(45) Date of Patent: Mar. 6, 2018

(54) SELECTORS WITH OXIDE-BASED LAYERS

(71) Applicant: Hewlett Packard Enterprise Development LP, Houston, TX (US)

(72) Inventors: Jianhua Yang, Palo Alto, CA (US); Ning Ge, Palo Alto, CA (US); Zhiyong Li, Foster City, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/308,923

(22) PCT Filed: May 5, 2014

(86) PCT No.: PCT/US2014/036736
§ 371 (c)(1),
(2) Date: Nov. 4, 2016

(87) PCT Pub. No.: WO2015/171103
PCT Pub. Date: Nov. 12, 2015

(65) Prior Publication Data
US 2017/0077179 A1    Mar. 16, 2017

(51) Int. Cl.
*H01L 27/24* (2006.01)
*H01L 45/00* (2006.01)

(52) U.S. Cl.
CPC ...... *H01L 27/2418* (2013.01); *H01L 27/2409* (2013.01); *H01L 45/00* (2013.01); *H01L 45/04* (2013.01); *H01L 45/085* (2013.01); *H01L 45/1233* (2013.01); *H01L 45/1266* (2013.01); *H01L 45/145* (2013.01); *H01L 45/146* (2013.01); *H01L 45/16* (2013.01)

(58) Field of Classification Search
CPC . H01L 27/2418; H01L 45/1266; H01L 45/16; H01L 45/085; H01L 45/00; H01L 45/04; H01L 45/145; H01L 45/146; H01L 27/2409; H01L 45/1233
USPC .......................................................... 257/4
See application file for complete search history.

(56) References Cited

U.S. PATENT DOCUMENTS

| 7,763,880 | B2 | 7/2010 | Williams | |
|---|---|---|---|---|
| 2008/0079029 | A1* | 4/2008 | Williams | ........... G11C 13/0009 257/213 |
| 2012/0166169 | A1 | 6/2012 | Lu | |

FOREIGN PATENT DOCUMENTS

| JP | 4592828 B2 | 12/2010 |
|---|---|---|
| KR | 1020120046327 A | 5/2012 |

(Continued)

OTHER PUBLICATIONS

Yang J., et al., Memristive Devices for Computing: Mechanisms, Applications and Challenges, USLI Process Integration 8 at the 224th Electrochemical Society Meeting, San Francisco Oct. 27-Nov. 1, 2013, HP Laboratories, HPL-2013-48.

(Continued)

*Primary Examiner* — Fernando L Toledo
*Assistant Examiner* — Adam S Bowen
(74) *Attorney, Agent, or Firm* — Hewlett Packard Enterprise Patent Department

(57) ABSTRACT

A selector with an oxide-based layer includes an oxide-based layer that has a first region and a second region. The first region contains a metal oxide in a first oxidation state, and the second region contains the metal oxide in a second oxidation state. The first region also forms a part of each of two opposite faces of the oxide-based layer.

15 Claims, 3 Drawing Sheets

(56) References Cited

FOREIGN PATENT DOCUMENTS

KR   1020130011600 A    1/2013
KR   1020130126268 A    11/2013
WO   WO-2013046217 A2   4/2013

OTHER PUBLICATIONS

Huang, J-J. et al., One Selector—one Resistor (1S1R) Crossbar Array for High-density Flexible Memory Applications, Department of Electronics Engineering and Institute of Electronics, National Chiao Tung University, Hsinchu, Taiwan, 978-1-4577-0505-2/11, Sep. 8, 2011, pp. 733-736.

International Searching Authority, The International Search Report and the Written Opinion, PCT/US2014/036736, dated Jan. 22, 2015, 11 Pages.

Lo, C. et al., Dependence of Read Margin on Pull-Up Schemes in High-Density One Selector—One Resistor Crossbar Array, IEEE Transactions on Electron Devices, vol. 60, No. 1 Jan. 2013, pp. 420-426.

Huang, J-J. et al., Bipolar Nonlinear Ni/TiO2/Ni Selector for 1S1R Crossbar Array Applications, IEEE Electron Device Letters, vol. 32, No. 10, Oct. 10, 2011, pp. 1427-1429.

* cited by examiner

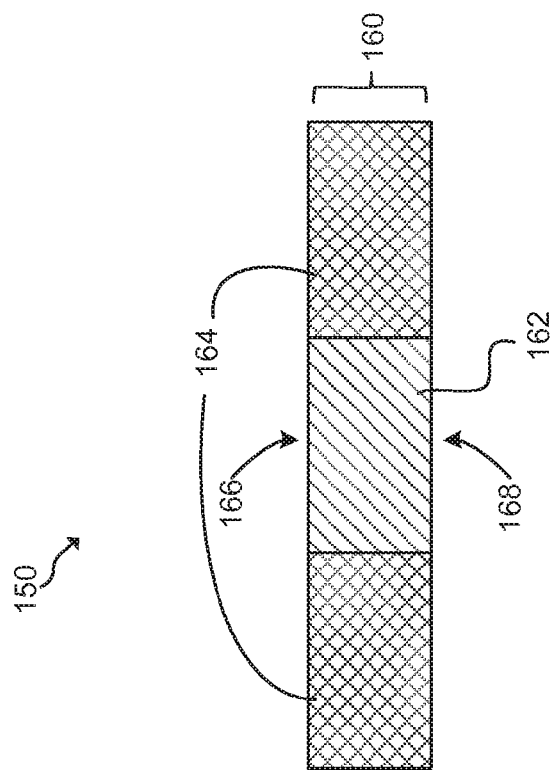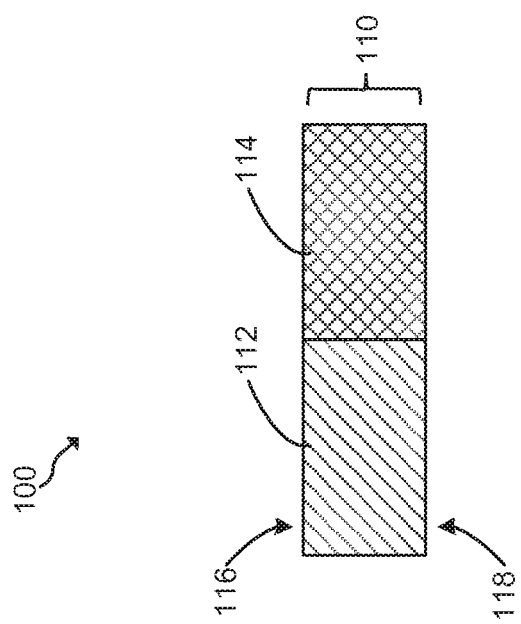
FIG. 1A
FIG. 1B

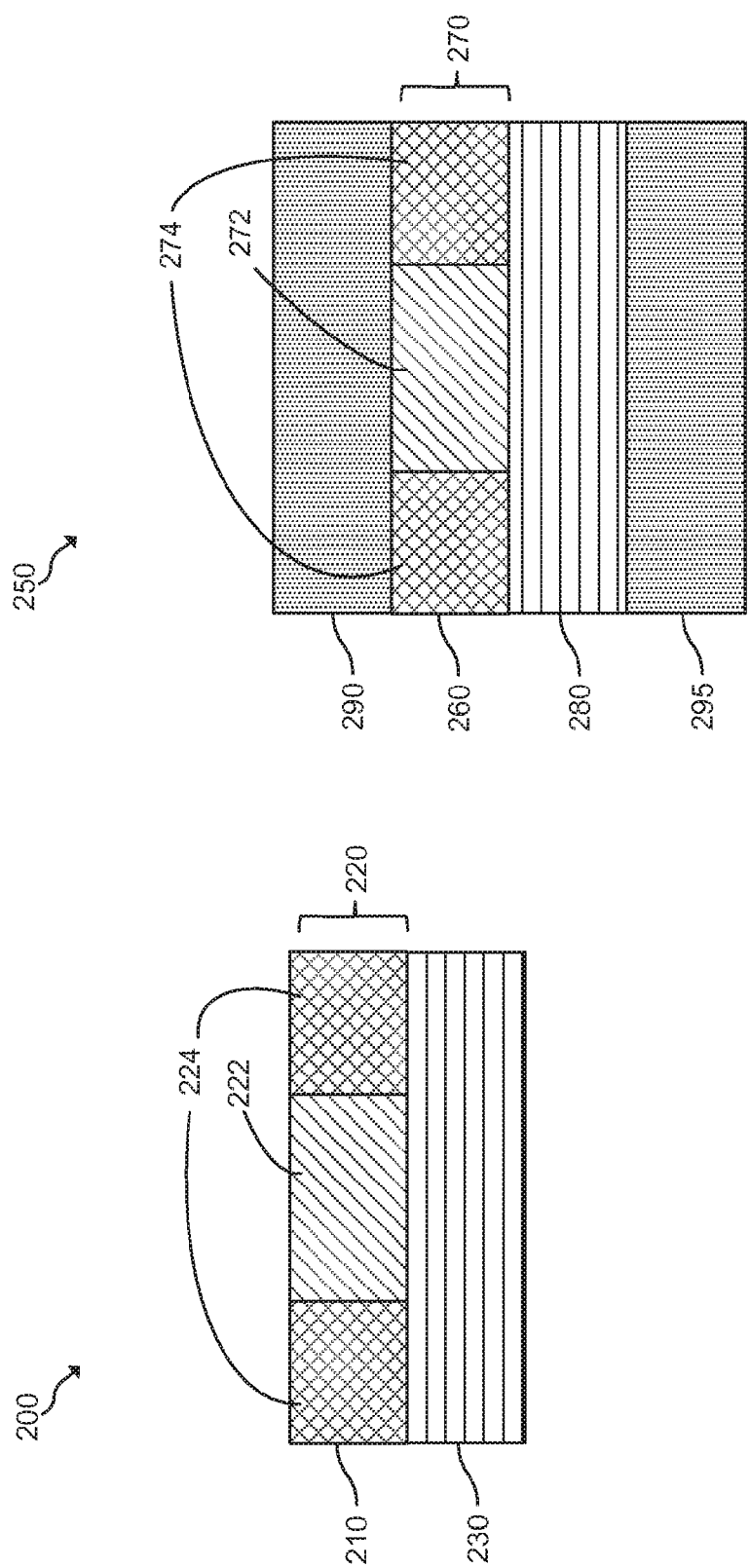

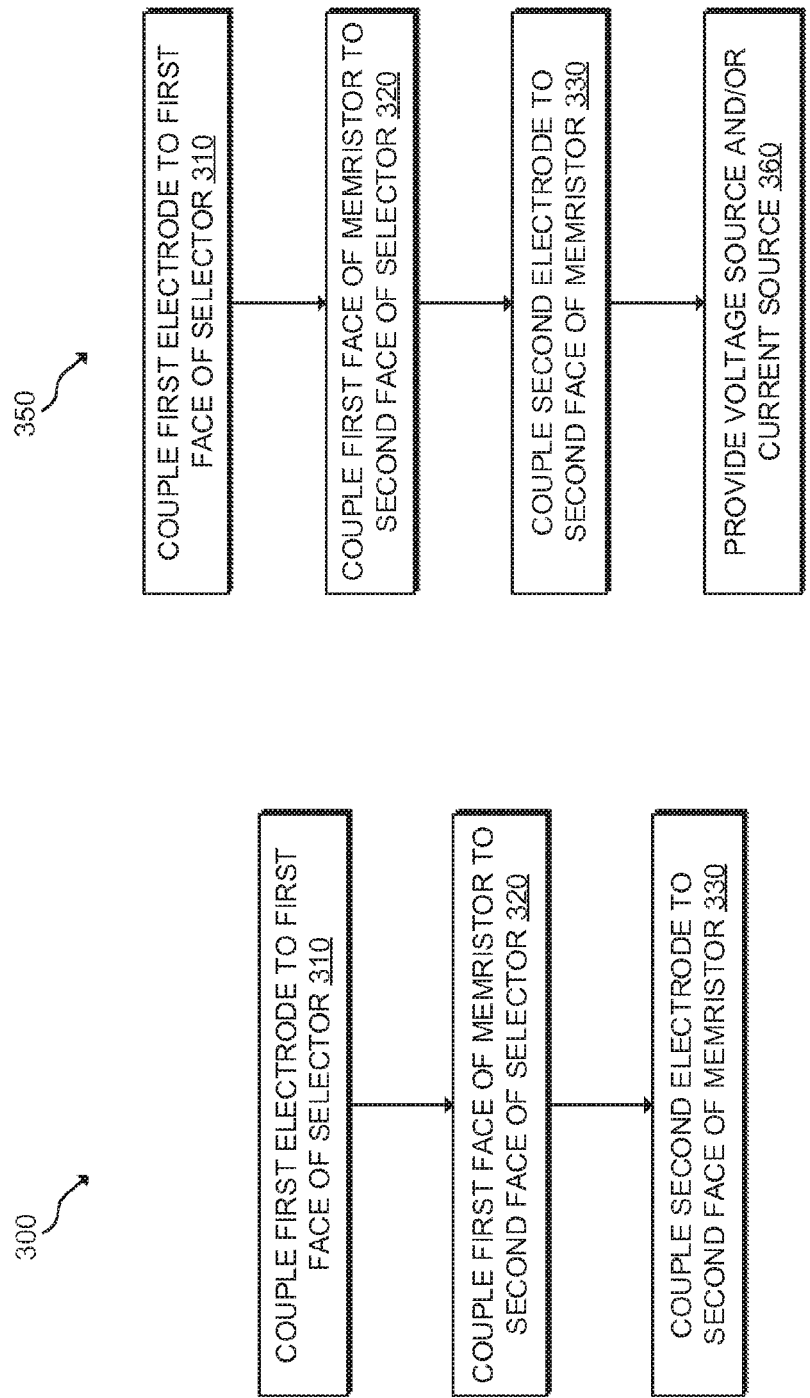

SELECTORS WITH OXIDE-BASED LAYERS

BACKGROUND

Selectors are devices that may control the electrical properties of electronic devices containing said selectors. Selectors may be combined with memristors to form crossbar arrays of memory devices. Memristors are devices that can be programmed to different resistive states by applying a programming energy, such as a voltage. Large crossbar arrays of memory devices can be used in a variety of applications, including random access memory, non-volatile solid state memory, programmable logic, signal processing control systems, pattern recognition, and other applications.

BRIEF DESCRIPTION OF THE DRAWINGS

The following detailed description references the drawings, wherein:

FIG. 1A is a cross-sectional view of an example selector with an oxide-based layer;

FIG. 1B is a cross-sectional view of an example selector with an oxide-based layer with a first region sandwiched between two parts of a second region;

FIG. 2A is a cross-sectional view of an example memory device having a selector with an oxide-based layer coupled to a memristor;

FIG. 2B is a cross-sectional view of an example memory device having a memristor, electrodes, and a selector with an oxide-based layer;

FIG. 3A is a flowchart of an example method for manufacturing a memory device;

FIG. 3B is a flowchart of an example method for manufacturing a memory device including providing a voltage source and/or a current source.

DETAILED DESCRIPTION

Memristors are devices that may be used as components in a wide range of electronic circuits, such as memories, switches, radio frequency circuits, and logic circuits and systems. In a memory structure, a crossbar array of memory devices having memristors may be used. When used as a basis for memory devices, memristors may be used to store bits of information, 1 or 0. The resistance of a memristor may be changed by applying an electrical stimulus, such as a voltage or a current, through the memristor. Generally, at least one channel may be formed that is capable of being switched between two states—one in which the channel forms an electrically conductive path ("ON") and one in which the channel forms a less conductive path ("OFF"). In some other cases, conductive paths represent "OFF" and less conductive paths represent "ON".

Using memristors in crossbar arrays may lead to read or write failure due to sneak currents passing through the memory cells that are not selected—for example, cells on the same row or column as a targeted cell. Failure may arise when the total current from an applied voltage is higher than the current through the targeted memristor due to current sneaking through untargeted neighboring cells. Using a transistor with each memristor has been proposed to isolate each cell and overcome the sneak current. However, using a transistor with each memristor in a crossbar array limits array density and increases cost, which may impact commercialization. As a result, effort has been spent to investigate using a nonlinear selector with each memristor in order to increase the current-voltage nonlinearity of each memory cell of a crossbar array. However, many proposed selectors may be too conductive at prevalent design dimensions to effectively work with a memristor in a crossbar array.

Examples disclosed herein provide for selectors with oxide-based layers. In example implementations, a selector has an oxide-based layer, which includes a first region with a metal oxide in a first oxide state and a second region having the metal oxide in a second oxidation state. The second region may be less conducting than the first region. By having two separate regions of different conductivity, a larger selector have a similar conductance compared to a smaller selector having only the more conducting region. Without subscribing to any particular theory, electrical conductors generally decrease in conductance with decreasing size. Therefore, a selector with a first conducting region and a second less conducting region may be less conductive overall than a selector of the same size having only the first region. Accordingly, a selector with a desired conductance may be used in a memory device at prevalent design dimensions.

Referring now to the drawings, FIG. 1A depicts an example selector 100 having an oxide-based layer 110. Oxide-based layer 110 may have a first region 112 having a metal oxide in a first oxidation state and a second region 114 having the metal oxide in a second oxidation state. First region 112 may form a part of each of two opposite faces of oxide-based layer 110—first face 116 and second face 118. Generally, second region 114 may also form a part of each of first face 116 and second face 118.

Selector 100 may be an electrical component placed in series with other components, such as memristors, that controls the overall electrical properties of resulting combination devices. Selector 100 may be a number of types of selectors, such as a crested tunnel barrier selector or a non-differential resistance selector. In many examples, selector 100 may exhibit nonlinear current-voltage behavior in certain voltage ranges. In other words, when a voltage applied across selector 100 is changed, the current passing through the selector 100 changes by a factor, "k". Generally, the factor "k" may be a function of voltage. In other words, factor "k" may vary depending on the voltage applied. For example, the current change between an applied one volt and two volts may be different than the current change between two volts and three volts. In some implementations, selector 100 may exhibit I-V nonlinearity in a voltage range of interest, such as, for example, the voltage ranges used for reading memory devices in crossbar arrays.

The metal oxide may be a compound of at least one metal ion and at least one oxygen ion. The metal on may be a metal cation (positively charged ion) that forms an oxide with oxygen anions (negatively charged ions). Oxidation state refers to the degree of oxidation of the metal ion. For example, an oxidation state of +4 refers to a metal oxidized by two oxygen ions, each having a charge of −2. Metal oxides may behave as semiconductors with a band gap that conducts current at high enough voltages. Same metal oxides in different oxidation states may have different band gaps, and therefore different electrical conductance. Generally, a material with a larger band gap requires a larger voltage to be conducting than a material with a smaller band gap.

In some examples herein, the metal oxide of second region 114 in the second oxidation state may have a larger band gap than the metal oxide of first region 112 in the first oxidation state. Accordingly, second region 114 may be less conducting than first region 112. Combined with the fact that materials decrease in conductance with decreasing size of the connecting surfaces, selector 100 with first region 112 and second region 114 may conduct less current at an applied voltage than a similarly sized selector that only has the metal oxide in the first, more conducting, oxidation state.

The metal oxide of selector 100 may have a metal selected from a variety of candidates. Non-limiting examples of the oxide-forming metal include niobium (Nb), vanadium (V), titanium (Ti), tungsten (W), tantalum (Ta), molybdenum (Mo), Zinc (Zn), and chromium (Cr). In one example, the metal oxide of selector 100 has Nb. The oxide of first region 112 may be niobium dioxide ($NbO_2$) which has an oxidation state of +4, and second region 114 may have niobium pentoxide ($Nb_2O_5$) with an oxidation state of +5. $NbO_2$ has a smaller band gap than $Nb_2O_5$, making first region 112 more conducting than second region 114.

Selector 100 may be formed by a number of methods. For example, oxide-based layer 110 may initially be formed containing only a first region 112 having $NbO_2$. To shrink the size of first region 112, further oxidation of the niobium oxide from the lower band gap $NbO_2$ into the higher band gap $Nb_2O_5$ may be enabled in order to create a less conducting second region 114. By converting portions of first region 112 into second region 114, the more conducting area of selector 100 is effectively reduced.

FIG. 1B depicts an example selector 150 with an oxide-based layer 160 with a first region 162 sandwiched between two parts of a second region 164. As in selector 100 of FIG. 1A, first region 162 may have a metal oxide in a first oxidation state, and second region 164 may have the metal oxide in a second oxidation state. First region 162 may form a part of each of two opposite faces of oxide-based layer 160—first face 166 and second face 168. Generally, second region 164 may also form a part of each of first face 166 and second face 168.

The two parts of second region 164 may sandwich first region 162 in a lateral direction of oxide-based layer 160. This orientation allows first region 162 to form a part of each of first face 166 and second face 168. Any component that may be coupled to selector 150 via first face 166 or second face 168 may accordingly form a continuous electrical path with first region 162 through a portion of the respective coupling face.

One example process for forming selector 150 may initially involve forming oxide-based layer 160 containing only a first region 162 having a metal oxide in a first oxidation state. To form second region 164, the metal oxide may be further oxidized from the first oxidation state to a second oxidation state that makes up second region 164. In some examples, first face 166 and second face 168 may be coupled to other components, and the other edges of oxide-based layer 160 may be exposed to an oxidizing environment. Accordingly, further oxidation initiates and propagates from the exposed edges of oxide-based layer 160, creating two parts of second region 164 that sandwich the original first region 162.

FIG. 2A depicts an example memory device 200 having a selector 210 with an oxide-based layer 220 coupled to a memristor 230. Oxide-based layer 220 may have a first region 222 that has a metal oxide in a first oxidation state. Oxide-based layer 220 may also have a second region 224 that has the metal oxide in a second oxidation state, which may be less conducting than the metal oxide in the first oxidation state. First region 222 may form a part of each of two opposite faces of oxide-based layer 220. Memristor 230 may be coupled to at least a portion of first region 222 via one of the two opposite faces of oxide-based layer 220 to form a continuous electrical path through memristor 230 and first region 222.

Similar to selector 100 of FIG. 1A, selector 210 may be an electrical component placed in series with other components—such as memristor 230—that controls the overall electrical properties of resulting combination devices, such as memory device 200. Selector 210 may be a number of types of selectors and may exhibit nonlinear current-voltage behavior in certain voltage ranges. Selector 210 may have a variety of orientations for first region 222 and second region 224. For memory device 200 depicted in FIG. 2A, second region 224 of selector 210 has two parts that sandwich first region 222, similar to the orientation of selector 150 of FIG. 1B.

The metal oxide that forms oxide-based layer 220 may be a compound of at least one metal ion and at least one oxygen ion. Metal oxides may behave as semiconductors with a band gap that conducts current at high enough voltages. Same metal oxides in different oxidation states may have different band gaps, and therefore different electrical conductance. Generally, a material with a larger band gap requires a larger voltage to be conducting than a material with a smaller band gap. In some examples herein, the metal oxide of second region 224 in the second oxidation state may have a larger band gap than the metal oxide of first region 222 in the first oxidation state. Accordingly, second region 224 may be less conducting than first region 222. Combined with the fact that materials decrease in conductance with decreasing size of the connecting surfaces, selector 210 with first region 222 and second region 224 may conduct less current at an applied voltage than a similarly-sized selector that only has the metal oxide in the first, more conducting, oxidation state.

The metal oxide of selector 210 may have a metal selected from a variety of candidates. Non-limiting examples of the oxide-forming metal include niobium (Nb), vanadium (V), titanium (Ti), tungsten (W), tantalum (Ta), molybdenum (Mo), Zinc (Zn), and chromium (Cr). In one example, the metal oxide of selector 210 has Nb. The oxide of first region 222 may be niobium dioxide ($NbO_2$) which has an oxidation state of +4, and second region 224 may have niobium pentoxide ($Nb_2O_5$) with an oxidation state of +5. $NbO_2$ has a smaller band gap than $Nb_2O_5$, making first region 222 more conducting than second region 224.

Memristor 230 may have a resistance that changes with an applied voltage across or current through memristor 230. Furthermore, memristor 230 may "memorize" its last resistance. In this manner, memory device 200 may be set to at least two states. Each memory device 200 may, for example, be a single memory cell in a crossbar array. An array of multiple memory devices 200 having selector 210 and memristor 230 may, for example, be utilized in nonvolatile resistive memory, such as resistive random access memory (RRAM).

Memristor 230 may be based on a variety of materials. Memristor 230 may be oxide-based, meaning that at least a portion of the memristor is formed from an oxide-containing material. Memristor 230 may also be nitride-based, meaning that at least a portion of the memristor is formed from a nitride-containing composition. Furthermore, memristor 230 may be oxy-nitride based, meaning that a portion of the memristor is formed from an oxide-containing material and that a portion of the memristor is formed from a nitride-containing material. In some examples, memristor 230 may be formed based on tantalum oxide ($TaO_x$) or hafnium oxide ($HfO_x$) compositions. Other example materials of memristor 230 may include titanium oxide, yttrium oxide, niobium oxide, zirconium oxide, aluminum oxide, calcium oxide, magnesium oxide, dysprosium oxide, lanthanum oxide, silicon dioxide, or other like oxides. Further examples include nitrides, such as aluminum nitride, gallium nitride, tantalum nitride, and silicon nitride. In addition, other functioning memristors may be employed in the practice of the teachings herein. For example, memristor 230 may have multiple layers that include electrodes and dielectric materials.

Memory device 200 may be formed by a variety of techniques. For example, the components of memory device may be formed individually and then stacked together in layers. Alternatively, selector 210 may first be formed with oxide-based layer 220 containing only a first region 222 having a metal oxide in a first oxidation state. Selector 210 may then be coupled with memristor 230 to form memory device 200. To form second region 224, the metal oxide may be further oxidized from the first oxidation state to a second oxidation state that makes up second region 224 by exposing memory device 200 to an oxidizing environment. Some example techniques for forming selector 210 and memristor 230 may include ion beam assisted deposition, sputtering, atomic layer deposition, evaporation, and chemical vapor deposition.

FIG. 2B depicts an example memory device 250 having a memristor 280, first electrode 290, second electrode 295, and a selector 260 with an oxide-based layer 270, which has a first region 272 and a second region 274. First electrode 290 may be coupled to a first face of oxide-based layer 270 of selector 260 so that first electrode 290 contacts both first region 272 and second region 274. Memristor 280 may be coupled to a second face of oxide-based layer 272 of selector 260 via a first face of memristor 280 so that the first face of memristor 280 contacts both first region 272 and second region 274. Second electrode 295 may be coupled to a second face of memristor 280, generally opposite the first face.

The metal oxide of second region 274 in the second oxidation state may have a larger band gap than the metal oxide of first region 272 in the first oxidation state. Accordingly, second region 274 may be less conducting than first region 272. Combined with the fact that materials decrease in conductance with decreasing size of the connecting surfaces, selector 260 with first region 272 and second region 274 may conduct less current at an applied voltage than a similarly sized selector that only has the metal oxide in the first, more conducting, oxidation state. For design purposes, first electrode 290, selector 260, memristor 280, and second electrode 295 may need the same contact area. Therefore, having a selector 260 with two regions allows the reduction of the conductance of selector 260 without reducing its size, which would otherwise prompt the analogous reduction of size of the electrodes 290 and 295 and memristor 280.

Memory device 250 may be formed by a variety of techniques. For example, the components of memory device 250 may be formed by sequentially depositing each layer. Some example techniques for forming first electrode 290, selector 260, memristor 280, and second electrode 295 may include ion beam assisted deposition, sputtering, atomic layer deposition, evaporation, and chemical vapor deposition. Selector 260 may initially be formed to have oxide-based layer 270 containing only a first region 272 having a metal oxide in a first oxidation state. To form second region 274, the metal oxide may be further oxidized from the first oxidation state to a second oxidation state that makes up second region 274. Because two opposite faces of oxide-based layer 270 are coupled to first electrode 290 and memristor 280, the other edges of oxide-based layer 270 may be exposed to an oxidizing environment. Accordingly, further oxidation initiates and propagates from the exposed edges of oxide-based layer 270, creating two parts of second region 274 that sandwich the original first region 272. Thus, the conductance of oxide-based layer 270 is effectively reduced.

First electrode 290 and second electrode 295 may be electrically conducting. In applications for memory crossbar arrays, first electrode 290 and second electrode 295 may connect memory device 250 to row and column lines of the crossbar array. Non-limiting example materials for first electrode 290 and second electrode 295 include Pt Ta, Hf, Zr, Al, Co, Ni, Fe, Nb, Mo, W, Cu, Ti, TiN, TaN, Ta$_2$N, WN$_2$, NbN, MoN, TiSi$_2$, TiSi, Ti$_5$Si$_3$, TaSi$_2$, WSi$_2$, NbSi$_2$, V$_3$Si, electrically doped Si polycrystalline, electrically doped Ge polycrystalline, and combinations thereof. In some implementations, first electrode 290 and second electrode 295 may include the same material. Alternatively, first electrode 290 may have a different material than second electrode 295.

FIG. 3A is a flowchart of an example method 300 for manufacturing a memory device, which may include block 310 for coupling a first electrode to a first face of a selector, block 320 for coupling a first face of a memristor to a second face of the selector, and block 330 coupling a second electrode to a second face of the memristor. Although execution of method 300 is herein described in reference to memory device 250 of FIG. 2B, other suitable parties for implementation of method 300 should be apparent, including, but not limited to, memory device 200 of FIG. 2A.

Method 300 may start in block 310, where first electrode 290 is coupled to a first face of selector 260. Coupling may mean forming an electrically-conducting connection between components. For example, selector 260 may be placed in physical contact with first electrode 290, forming a conducting path through at least portions of the two components. As described above, selector 260 may be an electrical component that controls the overall electrical properties of memory device 250. Selector 260 may have an oxide-based layer 270 having a first region 272 and second region 274. First region 272 may have a metal oxide in a first oxidation state, and second region 274 may have the metal oxide in a second oxidation state. The metal oxide in the second oxidation state may be less conducting than the metal oxide in the first oxidation state.

After coupling first electrode 290, method 300 may proceed to block 320, where a first face of memristor 280 is coupled to a second face of selector 260. The first face of memristor 280 may contact both first region 272 and second region 274 of oxide-based layer 270 of selector 260. The coupling may form a continuous electrical path between memristor 280 and first region 272. As described above, memristor 280 may be an electric component which may change resistance with an applied voltage or current. Furthermore, memristor 280 may "memorize" its last resistance. In this manner, memristor 280 may be set to at least two states, which may be used in memory applications. Memristor 280 may be based on a variety of materials, such as oxides, nitrides, and oxy-nitrides. In addition, other functioning memristors may be employed in the practice of the teachings herein After coupling memristor 280, method 300 may proceed to block 330, where a second electrode 295 is coupled to a second face of memristor 280. The coupling of second electrode 295 and memristor 280 may create a continuous electrical path and may complete a continuous electrical path through first electrode 290, first region 272 of electrode 260, memristor 280, and second electrode 295.

One example technique for completing the blocks of method 300 include depositing each part of memory device 250 as stacked layers. For example, first electrode 290 may be formed, followed by depositing oxide-based layer 270 onto first electrode 290 to form selector 260. Memristor 280 and second electrode 295 may be similarly deposited. Example techniques include ion beam assisted deposition, sputtering, atomic layer deposition, evaporation, and chemical vapor deposition. After forming memory device 250, the device may be exposed to an oxidizing environment to initiate further oxidation of the metal oxide from a first oxidation state to a second oxidation state. For some examples, such as ones described herein, the metal oxide in the second oxidation state is less conducting than the metal oxide in the first state. Accordingly, increasing the amount of second oxidation state effectively lowers the conductance of memory device 250.

FIG. 3B is a flowchart of an example method 350 for manufacturing a memory device that includes method 300 and block 360 for providing at least one of a voltage source and a current source for applying an electrical stimulus to the memory device. Although execution of method 350 is herein described in reference to improving the performance of memory device 250 of FIG. 2B, other suitable parties for implementation of method 350 should be apparent, including, but not limited to, memory device 200 of FIG. 2A.

At block 360, at least one of a voltage source and a current source for applying an electrical stimulus is provided to memory device 250. A voltage source or a current source may be, for example, a component, such as a circuit, that can provide an electrical stimulus to the memory device. In some examples, memory device 250 may have one of a voltage source or a current source. In other examples, memory device 250 may have both a voltage source and a current source or a single source that can applying both voltage and current. An electrical stimulus may be a voltage, current, or some other form of electrical stimulation.

Applying an electrical stimulus to memory device 250 may switch memristor 280, or an electrical stimulus may be applied to memory device 250 in order to read its resistive state, for example between "on" and "off". When an electrical stimulus is applied, memory device 250 may exhibit nonlinear I-V behavior due to the presence of selector 260. As described above, the resistance of selector 260 may change abruptly when an applied electric field reaches a certain level or magnitude. For example, a certain voltage may cause a certain current to pass through selector 260. Another voltage of a higher magnitude may, on the other hand, cause a significantly larger current to pass through selector 260. Nonlinear behavior of memory device 250 at operating voltages helps mitigate the sneak current problem, as described above.

The foregoing describes a number of examples for selectors with oxide-based layers and a number of example memory devices having memristors and said selectors. It should be understood that the selectors and memory devices described herein may include additional components and that some of the components described herein may be removed or modified without departing from the scope of selector or device. It should also be understood that the components depicted in the figures are not drawn to scale and thus, the components may have different relative sizes with respect to each other than as shown in the figures.

What is claimed is:

1. A selector, comprising an oxide-based layer, wherein:
   the oxide-based layer comprises a first region having a metal oxide in a first oxidation state and a second region having the metal oxide in a second oxidation state; and
   the first region forms a part of each of two opposite faces of the oxide-based layer, one of the two opposite faces coupled to a component to form a continuous electrical path through the component and the first region.

2. The selector of claim 1, wherein the second region has two parts sandwiching the first region in a lateral direction of the oxide-based layer.

3. The selector of claim 1, wherein the metal oxide in the second oxidation state is less conducting than the metal oxide in the first oxidation state.

4. The selector of claim 1, wherein the selector exhibits nonlinear current-voltage behavior in a voltage range of interest.

5. The selector of claim 1, wherein the metal oxide has a metal selected from the group consisting of Nb, V, Ti, W, Ta, Mo, Zn, and Cr.

6. The selector of claim 1, wherein the metal oxide has Nb, the first oxidation state is NbO2, and the second oxidation state is Nb2O5.

7. A memory device, comprising a selector with an oxide-based layer coupled to a memristor, wherein:
   the oxide-based layer comprises a first region having a metal oxide in a first oxidation state and a second region having the metal oxide in a second oxidation state;
   the first region forms a part of each of two opposite faces of the oxide-based layer;
   the metal oxide in the second oxidation state is less conducting than the metal oxide in the first oxidation state; and
   the memristor is coupled to at least a portion of the first region of the selector to form a continuous electrical path through the memristor and the first region.

8. The memory device of claim 7, further comprising a first electrode and a second electrode, wherein:
   the first electrode is coupled to a first face of the selector, wherein the first electrode contacts both the first region and the second region of the selector;
   the memristor is coupled to a second face of the selector via a first face of the memristor, wherein the first face of the memristor contacts both the first region and the second region of the selector;
   the second electrode is coupled to a second face of the memristor; and
   a continuous electrical path is formed through the first electrode, the first region of the selector, the memristor, and the second electrode.

9. The memory device of claim 7, wherein the selector exhibits nonlinear current-voltage behavior in a voltage range of interest.

10. The memory device of claim 7, wherein the metal oxide has a metal selected from the group consisting of Nb, V, Ti, W, Ta, Mo, Zn, and Cr.

11. The memory device of claim 7, wherein the metal oxide has Nb, the first oxidation state is NbO2, and the second oxidation state is Nb2O5.

12. The memory device of claim 7, wherein the first electrode and the second electrode each comprise a material selected from the group consisting of Pt, Ta, Hf, Zr, Al, Co, Ni, Fe, Nb, Mo, W, Cu, Ti, TiN, TaN, Ta2N, WN2, NbN, MoN, TiSi2, TiSi, Ti5Si3, TaSi2, WSi2, NbSi2, V3Si, electrically doped Si polycrystalline, electrically doped Ge polycrystalline, and combinations thereof.

13. A method for manufacturing a memory device, comprising:
- coupling a first electrode to a first face of a selector with an oxide-based layer, the first electrode contacting both a first region and a second region of the oxide-based layer of the selector, wherein the first region has a metal oxide in a first oxidation state and the second region has the metal oxide in a second oxidation state;
- coupling a first face of a memristor to a second face of the selector, the first face of the memristor contacting both the first region and the second region of the oxide-based layer of the selector; and
- coupling a second electrode to a second face of the memristor;
- wherein the metal oxide in the second oxidation state is less conducting than the metal oxide in the first oxidation state, and a continuous electrical path is formed through the first electrode, the first region of the selector, the memristor, and the second electrode.

14. The method of claim 13, further comprising providing at least one of a voltage source and a current source for applying an electrical stimulus to the memory device.

15. The method of claim 14, wherein the memory device exhibits nonlinear current-voltage behavior in a voltage range of interest.

* * * * *